United States Patent [19]

Kanai et al.

[11] Patent Number: 5,241,183
[45] Date of Patent: Aug. 31, 1993

[54] VERTICAL XY STAGE

[75] Inventors: Munenori Kanai; Sunao Ishihara; Atsunobu Une, all of Kanagawa, Japan

[73] Assignee: Nippon Telegraph and Telephone Corporation, Japan

[21] Appl. No.: 853,909

[22] Filed: Mar. 19, 1992

[30] Foreign Application Priority Data

Mar. 22, 1991 [JP] Japan ................................. 3-81125

[51] Int. Cl.$^5$ ........................................... G01N 21/00
[52] U.S. Cl. .......................... 250/453.11; 250/442.11; 248/178
[58] Field of Search ............. 250/453.1, 440.1, 442.11; 248/178

[56] References Cited

U.S. PATENT DOCUMENTS

| | | | |
|---|---|---|---|
| 4,492,356 | 1/1985 | Taniguchi et al. | 248/178 |
| 4,627,009 | 12/1986 | Holmes et al. | 250/442.11 |

FOREIGN PATENT DOCUMENTS

| | | |
|---|---|---|
| 0253283 | 1/1988 | European Pat. Off. |
| 0360272 | 3/1990 | European Pat. Off. |

OTHER PUBLICATIONS

Kanai et al., "An Elastic Fine Positioning Mechanism Applied To Contactless X-Y Table", Bull. Japan Soc. of Prec. Engg., vol. 17, No. 4 (1983), pp. 265-266.
Ishihara et al., "A Verical Stepper For Synchrotron X-Ray Lithography", J. Vac. Sci. Techol. B7(6), Nov./Dec. 1989, pp. 1652-1656.
Koga et al., "High-Performance Synchrotron Orbital Radiation X-Ray Stepper", J. Vac. Sci. Techol. B8(6), Nov./Dec. 1990, pp. 1633-1637.
Ishihara et al., "A Vertical X-Ray Stepper For SOR Lithography", Seimitsukougakukaishi 57/3/1991, (JPSE-57-03 '91-03-459), pp. 61-68.
Ishihara et al., "SOR X-Ray Stepper", NTT R & D vol. 39 No. 4 1990, pp. 581-590.

Primary Examiner—Paul M. Dzierzynski
Assistant Examiner—Kiet T. Nguyen
Attorney, Agent, or Firm—Blakely, Sokoloff, Taylor & Zafman

[57] ABSTRACT

A vertical XY stage includes a base, an X-axis slider, a Y-axis slider, and a stage. The X-axis slider is movably mounted on the base. The Y-axis slider is movably mounted on the X-axis slider. Workpieces are arranged on the stage. The Y-axis slider includes a horizontally arranged slider main body, and a vertical portion vertically arranged and having a guide for allowing the Y-axis slider to move in a Y-axis direction. The stage is arranged in a space surrounded by the slider main body and the vertical portion of the Y-axis slider. The stage can be pivoted through a shaft mounted on the Y-axis slider.

9 Claims, 6 Drawing Sheets

VERTICAL XY STAGE

BACKGROUND OF THE INVENTION

The present invention relates to an exposure system for fine semiconductor integral circuit patterns and, more particularly, to a vertical XY stage which can be suitably applied to an exposure system using synchrotron orbital radiation as a light source.

In the process of manufacturing a semiconductor device, an exposure system is used to expose circuit patterns on a semiconductor device substrate called a wafer coated with a sensitive material. In order to expose identical circuit patterns at a large number of portions on the wafer, the exposure system uses a vertical XY stage for moving the wafer in two axial directions.

With an increase in degree of integration of a semiconductor device, the wavelength of a replicating light source is reduced. As a future technique, a pattern replicating technique using synchrotron radiation (to be referred to as SR light hereinafter) has been developed. The wavelength of SR light is 1/100 or less that of an ultraviolet ray as a photo-lithography light source. Such short-wavelength light is used because diffraction and interference are reduced to allow replication of fine patterns as the wavelength of light is shortened.

This SR light is defined as a beam of an electromagnetic wave which is radiated in the tangential direction when a high-energy electron beam propagating at a speed approaching the velocity of light is bent by a magnet. The SR light is highly directional high-brightness light including light components from visible light to an x-ray. Of these light components, a soft x-ray having a wavelength of about 1 nm is extracted to be used as a light source for a pattern replication.

Figures 7, 8:
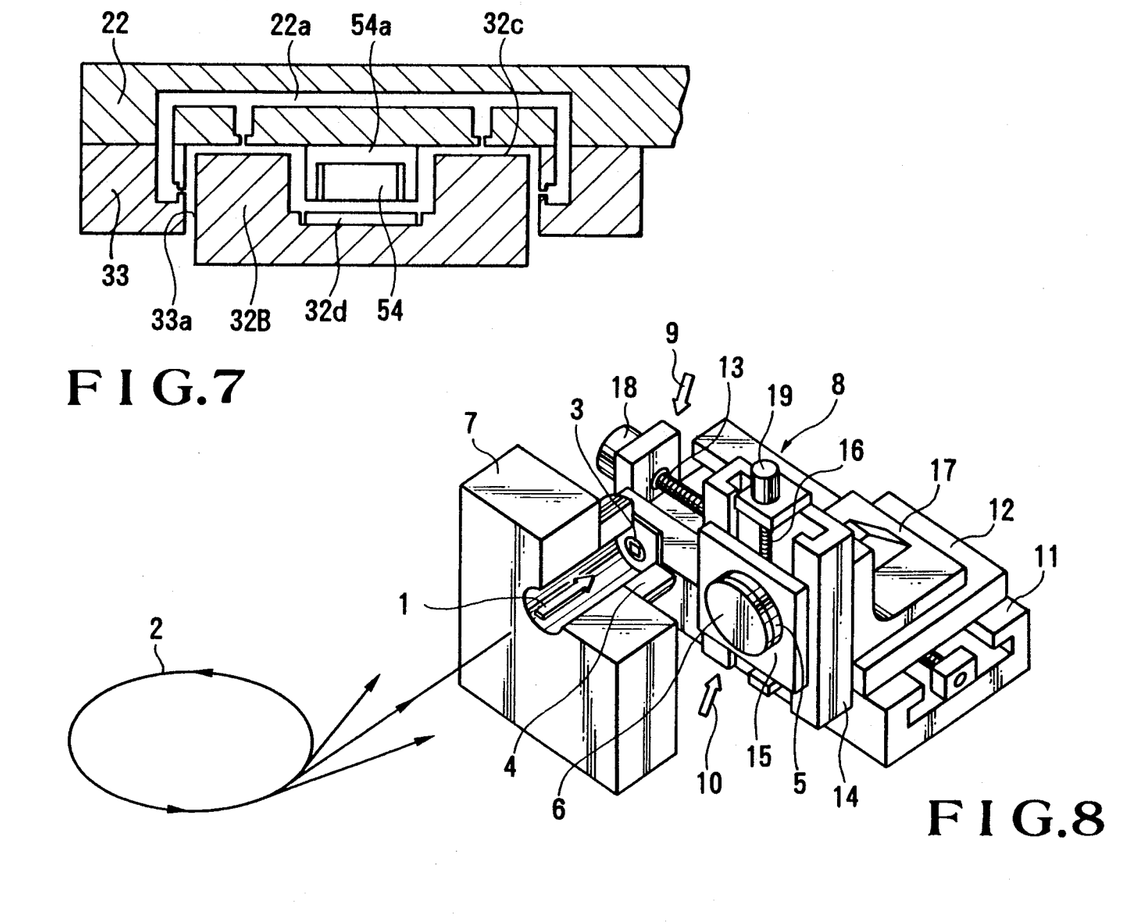
FIG. 7 is a view showing an air-lubricating mechanism of the X-axis slider.
FIG. 8 is a perspective view showing a conventional vertical XY stage.

FIG. 8 shows a conventional vertical XY stage used in an exposure system using such SR light as a light source. This vertical XY stage will be briefly described below. Referring to FIG. 8, reference numeral 1 denotes SR light, which is radiated in all directions within a plane parallel to tangents along which electron beams propagate from a doughnut-like ring 2 as a closed orbit within which high-energy electron beams are stored. An x-ray mask 3 is arranged in one of the directions of the SR light 1. A circuit pattern is formed on the x-ray mask 3. The SR light 1 is transmitted through the circuit pattern on the mask to form the shadow of the pattern onto a wafer. Reference numeral 4 denotes a mask stage for holding the x-ray mask 3 and controlling its position and posture; 5, a wafer stage for holding a wafer 6 by suction; 7, a detection system for observing alignment marks formed beforehand on the x-ray mask 3 and the wafer 6 to optically detect positioning errors; and 8, an XY stage for moving the wafer 6 in the X and Y directions. After positioning of the XY stage 8 and the mask stage 4 is performed by moving/adjusting them in accordance with positioning error detection signals based on the alignment marks, the SR light 1 is radiated to replicate the pattern of the x-ray mask 3 onto a sensitive material coated on the wafer 6.

The SR light 1 is normally radiated within a horizontal plane. For this reason, the x-ray mask 3 and the wafer 6 are vertically arranged within a vertical plane, and the XY stage 8 is of a vertical type. Although the SR light 1 is highly directional, it has a slight divergent property. If, therefore, the distance between the x-ray mask 3 and the wafer 6 is increased, a projected pattern shape is distorted or blurred. This makes it difficult to perform normal exposure. In order to prevent this, the distance between the x-ray mask 3 and the wafer 6 must be set to be very small, e.g., 50 μm or less.

Referring to FIG. 8, the wafer 6 is not on the SR optical axis where the x-ray mask 3 is set and is located at the position far from the mask 3, so the x-ray mask 3 and the wafer 6 are easily exchanged with other ones. When only an exposure process is taken into consideration, it is only required that the XY stage 8 be moved by an amount corresponding to an exposure area of the wafer 6. However, the x-ray mask 3 and the wafer 6 need to be sequentially exchanged with other ones. If, therefore, the XY stage has only a moving amount corresponding to the exposure area, it is almost impossible to exchange the x-ray mask 3 and the wafer 6 without damaging them in a state wherein they face each other with a small clearance secured therebetween. For this reason, after the x-ray mask 3 and the wafer 6 are exchanged with other ones in directions indicated by arrows 9 and 10 in FIG. 8, the wafer 6 is moved, by the XY stage 8, to a position where it faces the x-ray mask 3, and an exposure process is started.

The XY stage 8 comprises an X-axis guide 11, an X-axis slider 12, and an X-axis lead screw 13, which serve as a guide unit for moving the wafer 6 in the X direction, i.e., in the horizontal direction, and a Y-axis guide 14, a Y-axis slider 15, and a Y-axis lead screw 16, which serve as a guide unit for moving the wafer 6 in the Y direction, i.e., the vertical direction. In general, the Y-axis slider 15 is mounted on the X-axis slider 12, and the X- and Y-axis guides 11 and 14 serve as stationary members so that the X- and Y-axis sliders 12 and 15 are respectively moved in the X- and Y-axis directions by the lead screws 13 and 16. Reference numeral 17 denotes an angle plate for vertically connecting the Y-axis slider 15 onto the X-axis slider 12; 18, an X-axis driving motor; and 19, a Y-axis driving motor. In this case, the load of the X-axis driving motor 18 is larger than that of the Y-axis driving motor 19 because the motor 18 is designed to drive the X-axis slider 12, the angle plate 17, the Y-axis guide 14, and the Y-axis slider 15 together. The X-axis driving motor 18 inevitably has a larger capacity. The X-axis slider 12 is particularly required to have a moving amount equivalent to the sum of a stroke corresponding to the exposure area and a stroke required for exchange of the x-ray mask 3 and the wafer 6. That is, the X-axis slider 12 is required to have a moving amount about three to five times the exposure area. Consequently, the X-axis slider 12 is longer than the Y-axis slider 15, resulting in an increase in width of the vertical XY stage 8 in the horizontal direction.

As described above, in the conventional vertical XY stage 8 used in an SR exposure system, since the X-axis slider 12 is required to have a moving amount about three to five times the exposure area, the width of the stage 8 in the horizontal direction is inevitably increased, resulting in the following problems.

① As described above, the SR light 1 is radiated in all the directions within the plane parallel to the tangents along which electron beams rotate. Therefore, as the width of the vertical XY stage 8 is reduced, a larger number of exposure systems can be arranged in the radial direction around the ring 2, allowing the effective use of the ring 2. In the arrangement of the conventional vertical XY stage 8, however, in order to facilitate exchange of the x-ray mask 3 and the wafer 6, the width of the XY stage 8 must be increased in the horizontal plane direction perpendicular to the axis of the SR light 1, i.e., the X-axis direction. That is, the arrangement of the conventional vertical XY stage 8 is against the effective use of the ring 2.

② The lead accuracy of the XY stage 8 deteriorates. It may be considered that the lead accuracy of the XY stage 8 is determined by guide accuracy and lead accuracy in holding the posture of the stage, which are determined by machining accuracy of constituent members. In some method, a mechanism which slightly moves by an amount corresponding to the lead error of the XY stage 8 and an error measurement system are independently added to correct the error, thus increasing the accuracy. In this method, however, a mechanical system, a measurement system, a control system, and the like, each having accuracy or performance 10 or more times higher than that of the main body must be additionally mounted, resulting in an increase in weight and cost. Besides, the stage is complicated and easy to fail. In order to prevent such inconvenience, it is preferable that the final accuracy be ensured by only the main body. Therefore, it is important for the XY stage to have the simplest structure and a shape allowing an increase in machining accuracy of constituent members.

If the length of the X-axis slider 12 is increased, the X-axis guide 11 and the X-axis lead screw 13 must be increased in length accordingly. The machining accuracy is inversely proportional to the length even if the member strength is infinite. In addition, the member strength is inversely proportional to the third power of length and the fourth power of diameter. More specifically, in machining of a member, various types of force and stress, e.g., cutting force and grating force, residual stress and thermal stress accompanying plastic deformation, are applied to the member. In addition, when the member is fixed to a machining unit, chucking force and the like act on the member. If such force acts on the member, the member is deformed. As the member is deformed, machining accuracy deteriorates. That is, the strength of a member is the largest factor which affects the machining accuracy.

In other words, an increase in length of a member greatly decreases the machining accuracy, and this decrease in machining accuracy causes a deterioration in lead accuracy of the XY stage.

① The Y-axis slider 15 is unbalanced in weight. The weight applied to the X-axis slider 12 perpendicularly acts on the X-axis guide 11 and hence is supported by the guide surfaces. In this case, the static rotational load applied to the X-axis lead screw is only a friction force on the tooth surfaces, but the weight of the X-axis slider 12 itself does not act as a load. In contrast to this, the weight applied to the Y-axis slider 15 acts in the guiding direction of the Y-axis slider 15 and hence is supported by the Y-axis lead screw 16. Therefore, the weight of the Y-axis slider 15 directly acts as a rotational load on the Y-axis lead screw 16. This rotational load based on gravity acts in a direction opposite to the rotational direction of the Y-axis driving motor 19. This means that energy supplied to the Y-axis driving motor 16 must be changed depending on whether the Y-axis slider 15 is moved upward or downward. Such a change in energy adversely affects driving control of the Y-axis slider 15. As a result, the positioning accuracy of the Y-axis slider 15 deteriorates, or an increase in feed speed is hindered.

Note that the weights of the X- and Y-axis sliders 12 and 15 are preferably minimized. This is because a decrease in weight of each slider reduces the load applied to the driving motor and allows control to perform high-speed, high-accuracy positioning.

④ The conventional XY stage is lacking in safety against obstacles. The X-axis slider 12 is reciprocated between the exchange position for the wafer 6 and the exposure position. No problem is posed in forward movement. In backward movement, however, since the mask stage 4 and the wafer stage 5 pass each other, if the hand or finger of an operator is caught therebetween at the time of starting/maintenance of the apparatus, the operator is might be seriously injured. This is because the weight of the X-axis slider 12 itself and the weights of the Y-axis guide 14, the Y-axis slider 15, and the angle plate 17, which are supported by the X-axis slider 12, amount to a considerable weight, and such a heavy part does not easily stop once it is moved. If the motor is being driven, it is still more difficult to stop the X-axis slider 12. Under the circumstances, safety measures demand an excessively large load.

SUMMARY OF THE INVENTION

It is, therefore, a principal object of the present invention to provide a vertical XY stage which can achieve an increase in speed, accuracy, and safety as compared with a conventional XY stage.

It is another object of the present invention to provide a vertical XY stage which can shorten the width in the horizontal plane direction perpendicular to an SR optical axis, thereby realizing a compact structure.

It is still another object of the present invention to provide a vertical XY stage which allows the effective use of a ring of SR light.

It is still another object of the present invention to provide a vertical XY stage which has a simple structure and allows an increase in accuracy of a measurement system as compared with a conventional XY stage.

In order to achieve the above objects, according to the present invention, there is provided a vertical XY stage comprising a base, an X-axis slider movably mounted on the base, a Y-axis slider movably mounted on the X-axis slider, and a stage on which workpieces are arranged, wherein the Y-axis slider includes a horizontally arranged slider main body, and a vertical portion vertically arranged and having a guide for allowing the Y-axis slider to move in a Y-axis direction, the stage is arranged in a space surrounded by the slider main body and the vertical portion of the Y-axis slider, and the stage can be pivoted through a shaft mounted on the Y-axis slider.

DESCRIPTION OF THE PREFERRED EMBODIMENTS

Embodiments of the present invention will be described in detail below with reference to the accompanying drawings.

Figure 1:
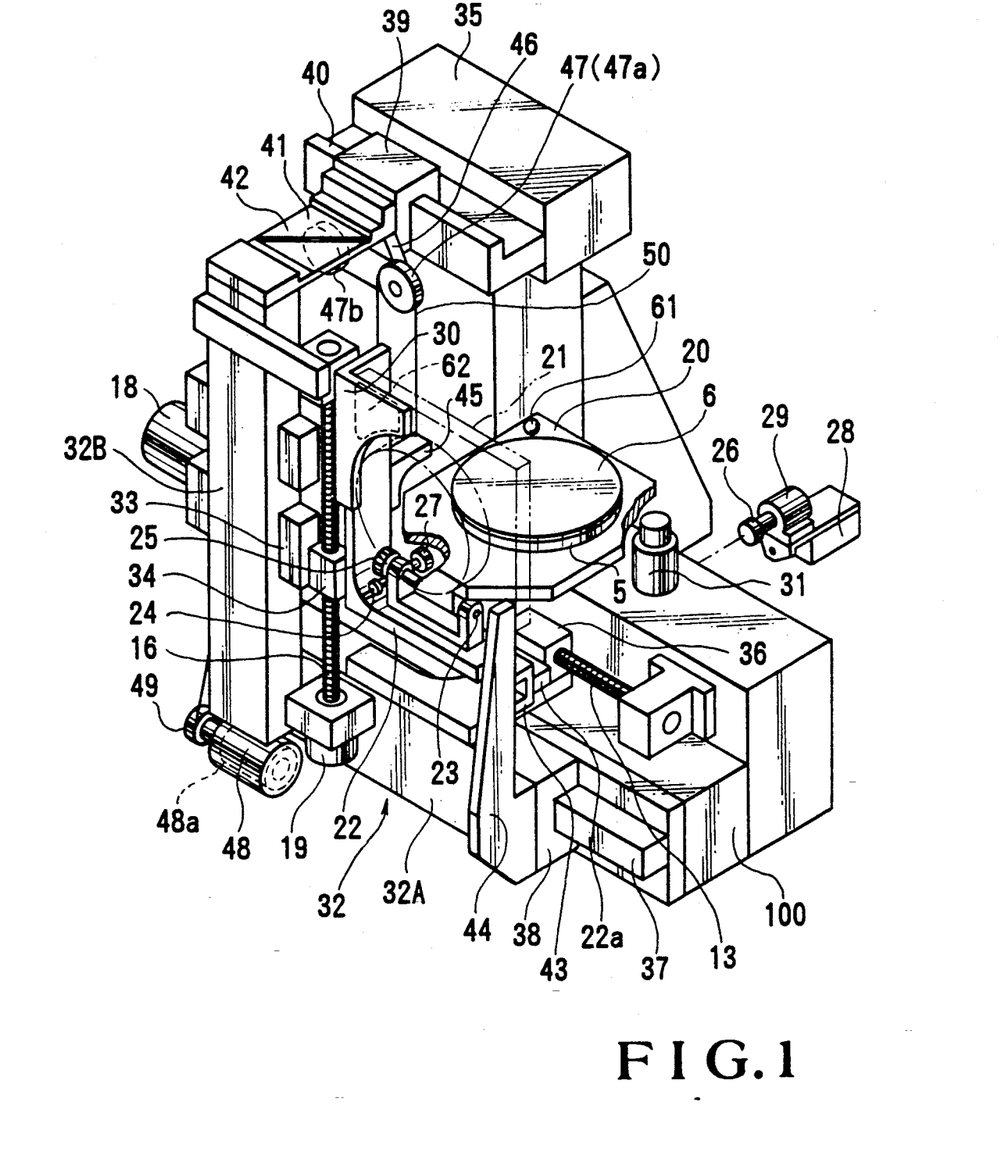
FIG. 1 is a partially cut-away exploded perspective view showing a vertical XY stage according to an embodiment of the present invention.
Figure 2:
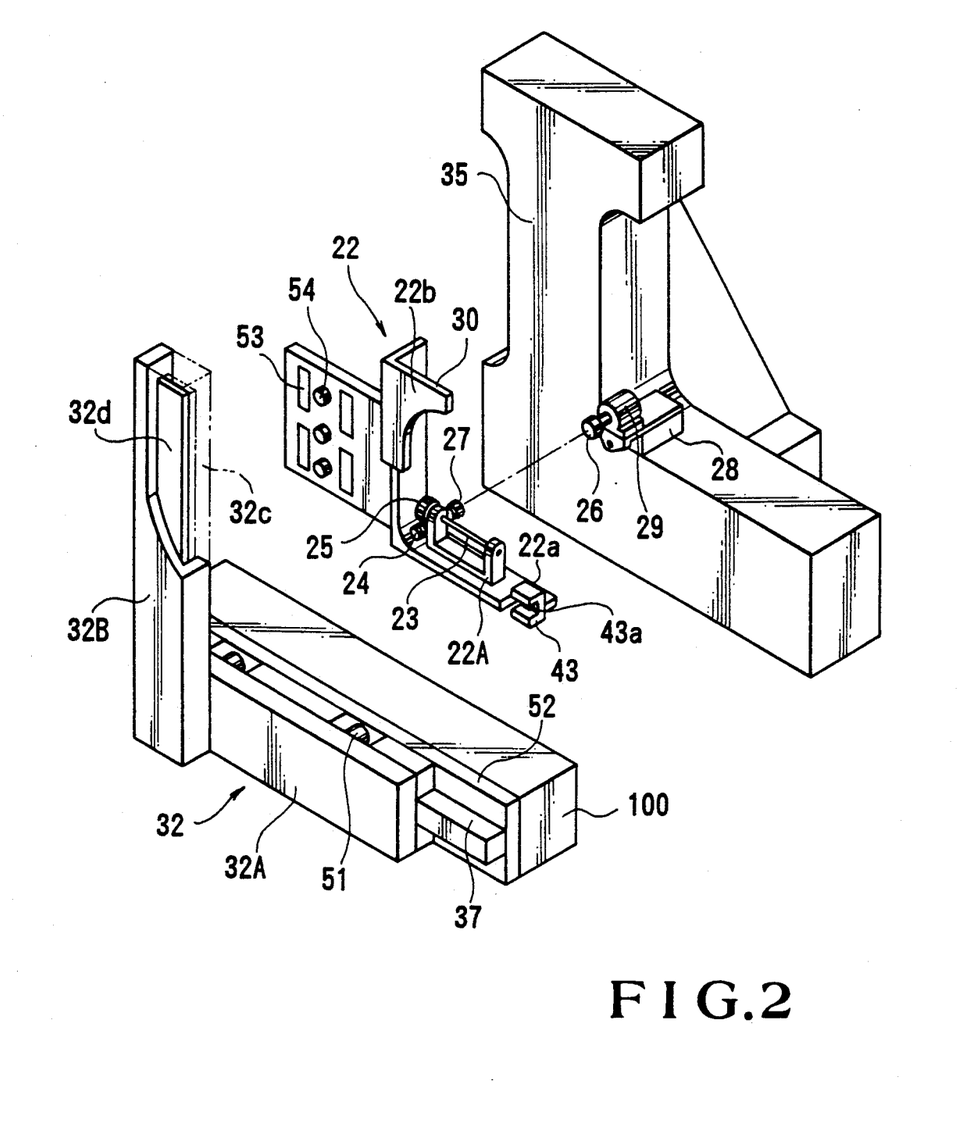
FIG. 2 is an exploded perspective view of main constituent members.

FIG. 1 is a partially cut-away exploded perspective view showing an opening state of a vertical XY stage according to an embodiment of the present invention. FIG. 2 is an exploded perspective view of main constituent members. Referring to FIGS. 1 and 2, reference numeral 20 denotes a stage on which a wafer stage 5 is mounted. This stage 20 is connected to a Y-axis slider 22 through an reclined shaft 23 which is horizontally arranged. With this structure, the stage 20 can be pivoted between a horizontal position (exchange position), indicated by solid lines in FIG. 1, and a vertical position (exposure position), indicated by broken lines 21. The stage 20 is designed to be pivoted by a pulse motor 29.

Figure 3:
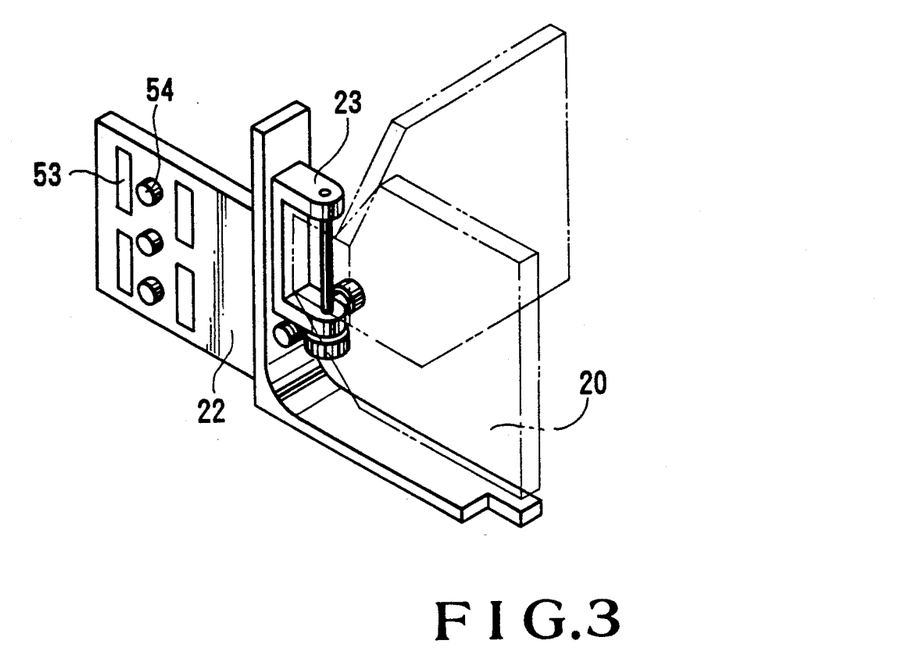
FIG. 3 is a view showing a structure for opening/closing a stage in the horizontal direction.

Even if the stage 20 is designed to be opened/closed in the horizontal direction, the same effect as described above can be obtained. Such a structure is shown in FIG. 3. Although the reclined shaft 23 is arranged in parallel to the horizontal axis of an L-shaped portion of the Y-axis slider 22 in FIG. 2, it can be arranged in parallel to the vertical axis of the L-shaped portion, as shown in FIG. 3. In this case, the reclined shaft is called an opening/closing shaft.

The objects of the present invention can be achieved regardless of whether the reclined shaft or opening/closing shaft scheme is employed. However, the difference between the reclined shaft scheme and the opening/closing shaft scheme is that the reclined shaft scheme is adversely affected by gravity. This will be described below with reference to FIG. 4.

Figure 4:
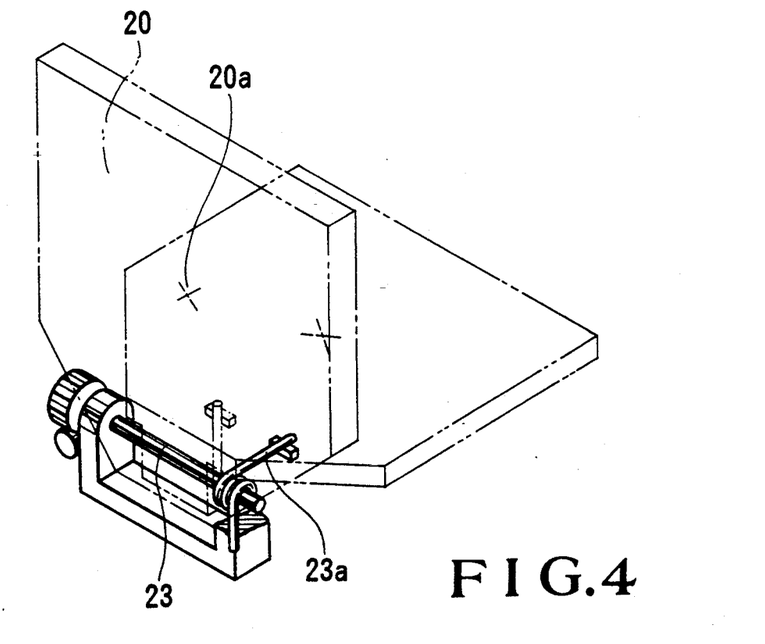
FIG. 4 is a view for explaining the influence of gravity on an reclinable stage.

Referring to FIG. 4, reference numeral 20a denotes the center of gravity of the stage 20; and 23a, a torsion coil spring mounted on the reclined shaft 23. In FIG. 4, when the stage 20 is set upright and laid horizontally, the position of the center of gravity of the stage 20 is changed. As a result, the moment of force applied to the reclined shaft 23 differs by an amount corresponding to the above-mentioned change. Since the magnitude of moment is the product of the weight of the stage 20 and horizontal component of the distance between the center of gravity 20a and the reclined shaft, when the stage 20 is set upright, the magnitude of moment of force is almost zero, i.e., the minimum value, but when the stage 20 is laid horizontally, the magnitude of moment of force is maximized.

It is required that the force required to rotate the reclined shaft, i.e., the horsepower of the pulse motor 29 be equal to or larger than the maximum value of the moment of force applied to the reclined shaft. If, however, the torsion coil spring 23a is added, as shown in FIG. 4, since the spring 23a is elastically deformed as the stage is inclined downward, the maximum value of the moment of force based on gravity can be greatly reduced accordingly. This makes it possible to reduce the size of an reclined power system including the pulse motor 29. Note that in the opening/closing scheme, since the stage 20 is rotated in the direction perpendicular to gravity, the above-described adverse influence is not present.

Figure 5A:
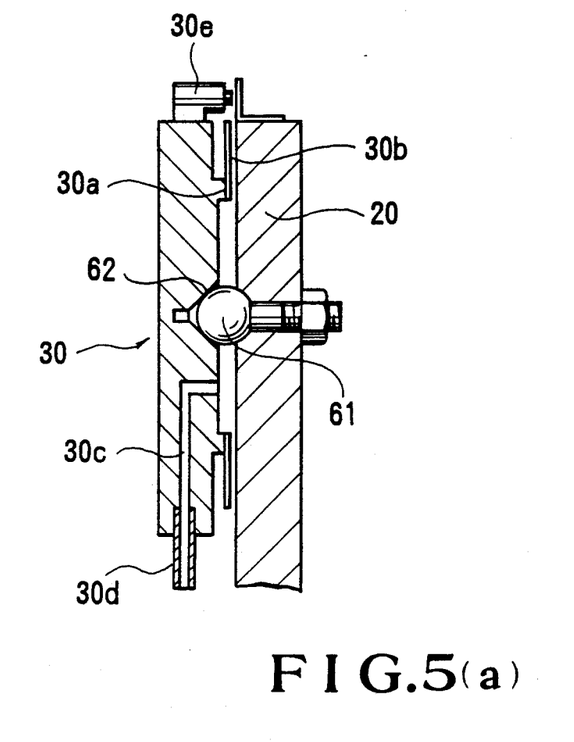
FIGS. 5(a) and 5(b) are views showing a vacuum chuck mechanism of the stage.
Figure 5B:
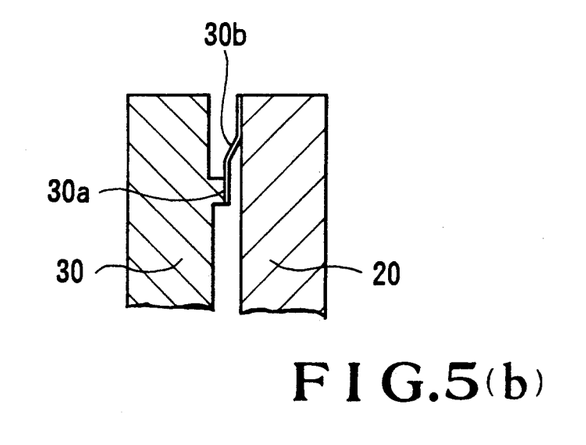

Referring back to FIGS. 1 and 2, the pulse motor 29 is fixed to an angle plate 35 constituting a unit fixing portion of the vertical XY stage through an air cylinder 28. Since the pulse motor 29 is concealed behind the stage 20 and hence cannot be seen in practice, FIG. 1 shows a state wherein the motor 29 is removed from the angle plate 35 together with the air cylinder 28 for the sake of an illustrative convenience. In this embodiment, the angle plate 35 has an L shape and is set upright, similar to the Y-axis solider 22. The rotation of the pulse motor 29 is transmitted to a worm 24 through a driving clutch 26 and a follower clutch 27. The rotation of the worm 24 is further transmitted to a worm wheel 25 to cause the reclined shaft 23 to pivot. As a result, the stage 20 is reciprocally pivoted between the horizontal exchange position and the vertical exposure position. Reference numeral 61 denotes a positioning pin having a spherical end and serving to fix the standing position of the stage 20. Although not shown in FIG. 1, a taper hole 62 in which the positioning pin 61 is fitted is formed in the back surface of a standing stopper 30 (FIG. 5). In addition, reference numeral 30b denotes a chuck ring consisting of a ring-like thin film and formed on the back surface of the standing stopper 30 to vacuum-chuck the stage 20. The process of fixing the standing position of the stage 20 by suction will be described in detail below with reference to FIGS. 5(a) an 5(b).

FIG. 5(a) shows a state of the stage 20 immediately before it is fixed by suction, in which only a portion near the positioning pin 61 is shown as a sectional view. Reference numeral 30a denotes a convex portion formed on the closed orbit to surround the taper hole 62. In addition, a very thin film is bonded on the convex portion 30a to extend outward in the form of a cantilever, thus forming a chuck pad 30b. Reference numeral 30c denotes an exhaust pass, which is connected to a hose 30d; and 30e, a proximity sensor for detecting that the stage 20 is at the standing position.

With such a sucking structure, when evacuation is performed through the hose 30d upon an operation of the proximity switch 30e, the clearance between the chuck pad 30b and the stage 20 is evacuated first, and air flows therebetween. Since the pressure in a direction perpendicular to the flow of air is reduced (the principle of spraying), the chuck pad 30b consisting of a thin film is pressed by atmospheric pressure from the backward. As a result, as shown in FIG. 5(b), the chuck pad 30b is automatically attached to the stage 20 to seal the closed space inside the chuck pad 30b. Consequently, the positioning pin 61 is strongly pressed against the taper hole 62 by atmospheric pressure to fix the standing position of the stage 20.

Referring to FIG. 1, connection and separation between the driving clutch 26 and the follower clutch 27 are performed by driving the pulse motor 29 in the forward and reverse directions upon driving of the air cylinder 28. Therefore, the reclined state position of the stage 20 is limited to predetermined positions within the strokes in the X- and Y-axis directions. The Y-axis slider 22 includes the standing stopper 30 for vacuum-chucking the stage 20 to hold it at the standing position. An electromagnetic laid stopper 31 for holding the stage 20 at the horizontal position by suction is integrally formed with the angle plate 35. Note that the stopper 31 is omitted in FIG. 2.

The Y-axis slider 22 is formed in an L shape, as shown in FIG. 2. A bracket 22A for axially supporting the two ends of the reclined shaft 23 is integrally formed on the upper surface of a horizontal portion 22a of the slider 22, whereas the standing stopper 30, an air pad 53 (to be described later), and a Y-axis magnet 54 are formed on a vertical portion 22b of the slider 22.

Reference numeral 32 denotes an L-shaped X-axis slider. A horizontal portion 32A and a vertical portion 32B of the X-axis slider 32 respectively constitute a slider main body and a guide for the Y-axis slider 22. Both the stage 20 and the Y-axis slider 22 are arranged in a space defined by the slider main body 32A and the vertical portion 32B. The Y-axis slider 22 is held by an air bearing formed by arranging a plurality of Y-axis air pads 33 on the two sides of the vertical portion 32B. The slider 22 has a Y-axis nut 34 to be threadably engaged with a Y-axis lead screw 16. When the Y-axis lead screw 16 is rotated by a Y-axis motor 19, the rotation of the screw is converted into the linear motion of the Y-axis nut 34. As a result, the Y-axis slider 22 is vertically moved along the vertical portion 32B.

An X-axis lead screw 13 for horizontally reciprocating the X-axis slider 32 is arranged on the angle plate 35 which supports the overall vertical XY stage. An air hydrostatic X-axis nut 36 is threadably engaged with the X-axis lead screw 13. The nut 36 is fixed to the slider main body 32A of the X-axis slider 32. With this structure, when the X-axis lead screw 13 is rotated by an X-axis motor 18, the rotation of the screw is converted into the linear motion of the X-axis nut 36 to reciprocate the X-axis slider 32. The X-axis lead screw 13 and the Y-axis lead screw 16 of the Y-axis slider 22 are arranged to be parallel to the slider main body 32A and the vertical portion 32B of the X-axis slider 32 and to be near the middle points between the stage 20 and the slider main body 32A and the vertical portion 32B so that the thrust centers of the lead screws 13 and 16, i.e., the positions of the nuts 34 and 36 of the slider main body 32A and the vertical portion 32B, are located near the centers of gravity of the X and Y planes of the sliders 22 and 32. Similar to the Y-axis slider 22, the X-axis slider 32 is guided by an air bearing formed by disposing a plurality of X-axis air pads 38 on the two sides of the X-axis guide 37 integrally formed with the angle plate 35 and the base 100.

Reference numeral 39 denotes an X-axis sub-slider, which is guided by an X-axis sub-guide 40, fixed to the angle plate 35, by means of an air bearing. The X-axis sub-slider 39 is connected to the upper surface of the vertical portion 32B of the X-axis slider 32 through a connecting plate 41 consisting of a flexible material. A Z-shaped groove 42 is formed in the upper surface of the connecting plate 41 so that the force of the X-axis sub-slider 39 advancing along the horizontal plane is transmitted better than other forces, which are released upon deformation of the connecting plate 41.

The structure of the connecting plate 41 will be described in detail below with reference to FIGS. 6(a) and 6(b).

Figure 6A:
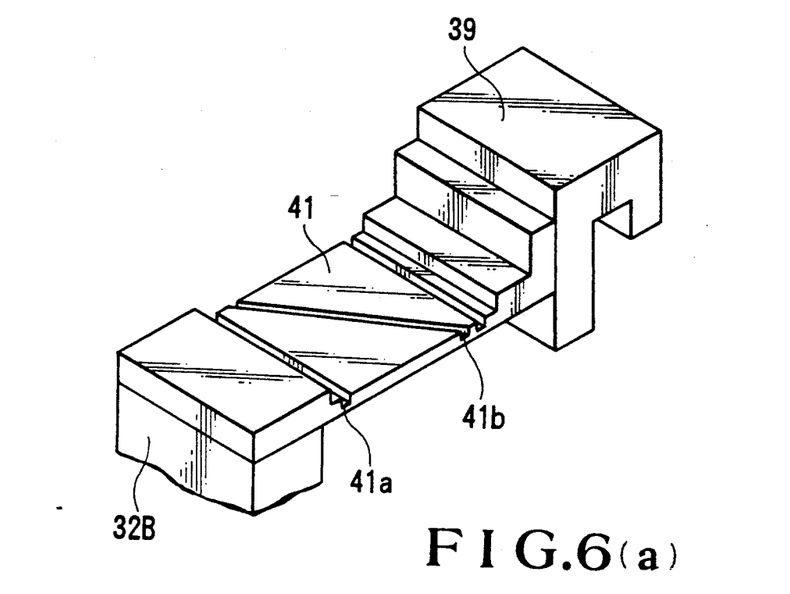
FIGS. 6(a) and 6(b) are perspective views showing a connecting plate for connecting an Y-axis slider to an X-axis sub-slider.

FIG. 6(a) is an enlarged view of the connecting plate 41. Two parallel notches 41a and an inclined notch 41b are formed in the connecting plate 41. The notches 41a respectively correspond to the upper and lower lines of the letter "Z"; and the notch 41b, the inclined line thereof. With this shape, the connecting plate 41 exhibits considerably high strength in a direction parallel to the plane surface, which is required to support the vertical portion 32B of the X-axis slider 32, but has very low strength in a direction perpendicular to the plane surface, which is not required to support the vertical portion 32B, because the notched portions are bent.

Figure 6B:
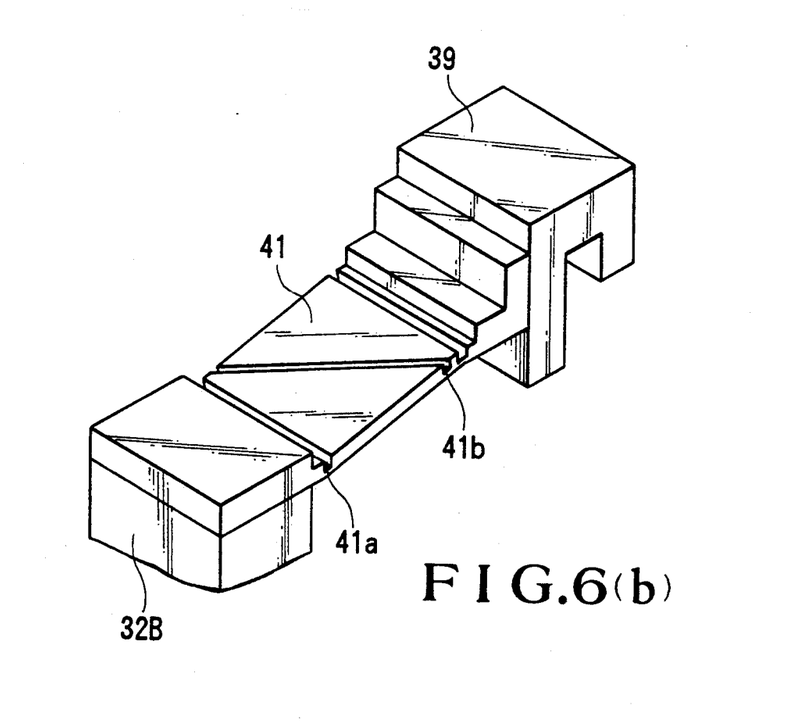

Owing to such a shape, as shown in FIG. 6(b), the assembly accuracy of the vertical portion 32B of the X-axis slider 32, the X-axis slider 32, and the X-axis sub-slider 39 need not be increased so much. Especially, in the vertical XY stage of the present invention, mechanical deformation caused by the application of the Y-axis weight onto the X-axis sub-slider 39 is absorbed by the connecting plate 41 so as not to transmit such deformation to the X-axis slider 32 demanding high accuracy.

A Y-axis sub-slider 43 having a C-shaped cross-section is formed on the end of the horizontal portion 22a of the Y-axis slider 22. This Y-axis sub-slider 43 serves to guide the end of the horizontal portion 22a along a Y-axis guide 44 fixed to the slider main body 32A of the X-axis slider 32 by means of an air bearing. Note that reference numeral 43a denotes a magnet arranged in the Y-axis sub-slider 43. The structure of this air bearing guide is constituted by a combination of a magnet and air outlets, similar to the structures of other air bearing guides. The X-axis sub-slider 40 or the Y-axis sub-slider 43 is designed to support only the end of the slider main body 32A of the X-axis slider 32 or the end of the horizontal portion 22a of the Y-axis slider 22 in an axial direction (to be referred to as the Z-axis direction) perpendicular to the X and Y planes. The above-described Z-shaped groove 42 is also based on such design. Such a structure is employed for the following reason. If guides are arranged at the two ends of each slider in the longitudinal direction to be parallel to each other, it is difficult to set the two axes to be parallel to each other. In addition, if the distance between the two axes is changed due to thermal expansion, the guide and the slider are caught with each other to become fixed. Therefore, one end of each slider needs to be formed as a free end.

Reference numeral 45 denotes a suspension hook fixed to the rear surface of the Y-axis slider 22 with bolts; 46, a suspension metal fitting having two pulleys (47a and 47b) and fixed to the X-axis sub-slider 39; and 48, a constant-force mechanism incorporating a spiral leaf spring 48a having the same function as the cord rewind mechanism of a vacuum cleaner. The constant-force mechanism 48 can wind a taking-up drum 49 with a constant torque to balance the weight of the Y-axis slider 22. Reference numeral 50 denotes a suspension wire having one end fixed to the suspension hook 45 and the other end fixed to the taking-up drum 49 through the two pulleys 47a and 47b. The taking-up drum 49 is arranged below the X-axis slider 32 so that the center of gravity of the slider 32 is located on the X-axis nut 36. The position and inclination of each pulley 47 is set such that the suspension hook 45 is located on the center of gravity of the Y-axis slider 22, i.e., on the Y-axis nut 34.

Reference numeral 51 denotes each X-axis magnet. The X-axis magnets 51 of the same number as that of those shown in FIG. 2 are arranged on the other side of the X-axis guide 37. Reference numeral 52 denotes a Z-axis guide plate consisting of a magnetic material and serving to support the X-axis slider 32 in the Z direction. Magnetic attractive force acts between the Z-axis guide plate 52 and the X-axis magnets 51. Since this attractive force is balanced by the air bearing of the X-axis air pads 38, the X-axis slider 32 is air-lubricated in a noncontact state. Reference numeral 53 denotes each air pad for supporting the Y-axis slider 22 in the Z direction. Y-axis Z guide surfaces 32c are both sides of the rear surface of the vertical portion 32B of the X-axis slider 32. Reference numeral 54 denotes each Y-axis magnet. Although not shown, the Y-axis magnets 54 are bonded/fixed in indentations formed in the rear surface of the vertical portion 32B of the X-axis slider 32 to which a Y-axis magnetic material plate 32d equivalent to the Z-axis guide plate 52 of the X-axis slider 32. The X-axis slider 32 is constituted by the same member and magnetic material as the Z-axis guide plate 52. In contrast to this, the Y-axis slider 22 is constituted by a member and a material different from the Z-axis guide plate 52. Similar to the X-axis slider 32, however, the Y-axis slider 22 is air-lubricated by balancing the air bearing pressure and the attractive force of the magnets. A balanced air-lubricating operation will be described in detail below with reference to the Y-axis.

FIG. 7 is a sectional view showing the vertical portion 32B of the X-axis slider 32, in which the vertical portion 32B is horizontally cut together with the Y-axis slider 32 and is seen from the above. The Y-axis magnet 54 is surrounded by a yoke 54a for effectively guiding a magnetic flux to the Y-axis magnetic material plate 32d. The Y-axis magnet 54 is fixed to the Y-axis slider 22. Reference numeral 22a denotes air-supply path for supplying high-pressure air into the bearing clearance defined by the Y-axis Z guide surface 32c and a Y-axis X guide surface 33a.

With such a structure, although when high-pressure air is supplied, the pressure in the bearing clearance is increased, since the Y-axis air pads 33 are arranged to oppose the vertical portion 32B, the right and left bearing pressures balance each other, and no problem is posed. However, since the Y-axis slider 22 and the bearing clearance defined by the Y-axis Z guide surface 32c are located on the same plane, as the bearing pressure is increased, the bearing clearance is increased. Consequently, no pressure is produced in the bearing clearance, and the clearance cannot serve as an air bearing. In the structure shown in FIG. 7, however, since attractive force based on magnetic force acts between the Y-axis magnet 54 and the Y-axis magnetic material plate 32d so as to balance the bearing pressure, the above-mentioned phenomenon does not occur, and the bearing clearance can serve as an air bearing.

Although the X-axis sub-slider 40 and the Y-axis sub-slider 43 are air-lubricated in the Z direction by balancing the air bearing pressures and the attractive force produced by the magnets in the same manner as described above, a repetitive description thereof will be omitted.

In brief, the sandwich type air bearing guides (33, 38) are formed in the XY plane directions, whereas the balanced air-lubricating type air bearing guide is formed in the Z direction by balancing the magnetic force and the air bearing force. In the balanced air-lubricating type, since only one guide surface is required per axis, the number of required air pads can be decreased accordingly. That is, the balanced air-lubricating type is more advantageous than the sandwich type air-lubricating guide in reducing the size and weight of a slider, even though the guide accuracy of the balanced air-lubricating type is slightly lower than that of the sandwich type. For a vertical XY stage, as its name is indicated, it is important to increase the lead accuracy and the speed in the X and Y directions. For this reason, the balanced air-lubricating type is employed only in the Z direction to decrease the weight of the stage, thereby contributing to an increase in speed and a reduction in required power. Furthermore, as guides, air bearings are employed for both the X- and Y-axis sliders 32 and 22. In addition to this, as described above, air hydrostatic screws are used for feed operations. With this structure, the vertical XY stage of the present invention is designed as a total air-lubricated stage. It is known that an air bearing allows guide accuracy 10 or more times higher than the machining accuracy of members owing to the unifying effect of an air-lubricating clearance. This equally applies to the lead accuracy of an air hydrostatic screw.

Note that both FIGS. 1 and 2 are drawn such that the half-stroke positions of the X- and Y-axis sliders 32 and 22 correspond to the reclining positions of the wafer stage 5 and the stage 20.

An operation of the vertical XY stage will be described below.

Referring to FIG. 2, in a state wherein the stage 20 is horizontally laid as indicated by the solid lines, the X-ray mask 3 and the wafer 6 can be exchanged with other ones by using a space above the stage 20. When the air cylinder 28 is driven forward to connect the driving clutch 26 to the follower clutch 27 of the Y-axis slider 22 so as to rotate the pulse motor 29, after the above-mentioned exchange is completed, the rotation of the motor 29 is transmitted to the reclined shaft 23 through the worm 24 and the worm wheel 25. As a result, the stage 20 is pivoted forward to stand upright, as indicated by the alternate long and two short dashed lines in FIG. 1. While the stage 20 is set upright, the positioning pin 61 having the spherical end and formed on the stage 20 is inserted in the conical taper hole 62 (FIG. 6(a) formed in the standing stopper 30, thus positioning the stage 20. Thereafter, the stage 20 is vacuum-chucked by the chuck ring 30b formed on the standing stopper 30 to accurately the exposure position. If the air cylinder 28 is caused to retreat after this operation, the connecting between the driving clutch 26 and the follower clutch 27 is released. When the X-axis motor 18 is driven, the X-axis slider 32 is moved in the X-axis direction along the X-axis guide 37. When the Y-axis motor 19 is driven, the Y-axis slider 22 is guided by the vertical portion 32B of the X-axis slider 32 to be moved in the Y-axis direction. As a result, the stage 20 is moved in the X and Y directions. It is apparent that since the X-ray mask 3 and the wafer 6 are exchanged in the reclined state of the stage 20, the moving amount of the vertical XY stage is only required such that each of the X- and Y-axis sliders 32 and 22 has a stroke corresponding to the exposure area.

If the stage 20 is restored to the above-mentioned reclining position and an operation reverse to the standing operation is executed after SR exposure is completed by moving the X- and Y-axis sliders 32 and 22 in the X and Y directions, the stage 20 is laid down, as shown in FIG. 1. If the coil of the reclined stopper 31 is excited after the stage 20 is laid down, since a magnetic member (not shown) mounted on the stage 20 is attracted, the horizontal position of the stage 20 can be accurately set, similar to the standing position, thus completing a sequence of operations.

In the present invention, the L-shaped X-axis slider is the main constituent element. The shape of the whole structure including the X- and X-axis sub-sliders is similar to a trapezoidal shape. Therefore, the main constituent element is not limited to an L shape. In addition, in above embodiment, the single reclined shaft 23 is horizontally arranged. However, the present invention is not limited to this. If, for example, two vertical shafts are synchronously driven, a double opening/closing door type structure can be obtained. If they are laid horizontally, a similar structure can be obtained. Furthermore, only the vertical XY stage uses the air bearings for the guides and the lead screws to secure the final accuracy required for the SR exposure system. If such high accuracy is not required, a vertical XY stage can be constituted by rolling type ball guides or ball screws. In an extreme case, even a linear motor can be employed in place of an air hydrostatic screw. That is, the present invention is not limited to the above-described structure. In addition, in the above embodiment, sequential exchange of X-ray masks and wafers can be realized without increasing the stroke of the vertical XY stage. It is apparent that sequential exchange of elements other than X-ray masks and wafers can be performed. Furthermore, if the lead screws 13 and 16 of the X- and Y-axis sliders 32 and 22 are located at the middle positions between the stage 20 and the X- and Y-axis guides, i.e., the vertical portion 32B of the X-axis slider 32, driving of the sliders 32 and 22 near the centers of gravity within the X and Y planes can be realized. It is, however, apparent that the positions of the lead screws are not limited to these but may be set any positions as long as they are parallel to the guides. Although the reclining position of the stage 20 is fixed by using the spherical positioning pin 61 and the taper hole 62, various combinations such as a sphere member and a flat surface, a tapered or cylindrical shaft and a hole can be used. In addition, only one positioning pin 61 is used. However, a plurality of positioning pins may be used. The stage is detachably fixed by vacuum suction or magnetic force. However, it is apparent that such an operation may be performed by electrostatic force.

When the stage 20 is to be laid down, the gravity moment difference is reduced by the torsion coil spring 23a. If, however, a spring is flexibly deformed as the stage 20 is pivoted, a torsion coil spring need not be used. For example, such a mechanism can be easily realized by using a simple leaf spring or a tension or compression type coil spring.

Moreover, the notch 41b of the connecting plate 41 has an inverted U shape. The present invention is not limited to this. For example, a V- or U-shaped notch can be easily expected.

Various changes and modifications can be made within the sprint and scope of the invention wherein in the vertical XY stage, in which the horizontal and vertical portions 32A and 32B of the L-shaped X-axis slider 32 respectively constitute the slider main body and the guide for the Y-axis slider 22, the stage 20 connected to the Y-axis slider 22 through the reclined shaft or the opening/closing shaft is arranged in the space surrounded by the horizontal and vertical portions, and supply/withdrawal of objects to/from the vertical XY stage is executed by utilizing the rotation of the stage 20.

As has been described above, according to the vertical XY stage of the present invention, the movement stroke in the X direction is only required to correspond to the exposure area of a wafer, so that the lengths of the guide of the X-axis slider and the lead screw can be shortened accordingly as compared with the conventional XY stage. This also improves the machining accuracy of each constituent element, resulting in an increase in lead accuracy of the vertical XY stage. In addition to such an advantage, the width of the stage can be shortened so that a large number of exposure systems can be arranged in the radial direction around the horizontal plane perpendicular to the SR optical axis. Furthermore, since the mask stage and the wafer stage do not pass each other, safety can be maintained against accidents in assembly adjustment or maintenance of each system. In addition, the scheme of the present invention, in which the driving mechanisms for reclining the stage are not mounted on the vertical XY stage but are separately mounted at the predetermined positions within the strokes in the X and Y directions, and power is transmitted thereto through the clutch means, is more advantageous in reducing a weight load onto the stage than the scheme in which the driving mechanisms are mounted on the stage. In addition, since the reclining position can be limited, the space behind the rear surface of the vertical stage, i.e., the space in the direction in which the stage is reclined, can be utilized. The addition of the torsion coil spring to the reclining mechanism serves to reduce the moment of force so as to reduce the size and weight of the mechanism. As a result, an increase in operating speed can be achieved together. Furthermore, according to the present invention, the standing position of the stage is fixed by the thin cantilever type chuck pad. More specifically, the thin film is automatically attached to the opposing vacuum chuck surface with suction to air-tightly seal the corresponding space. Even if the accuracy of the vacuum chuck surface is not so high and a clearance is formed between the chuck surfaces, since the thin film conforms to the opposing surface to air-tightly seal the space, considerably high sucking force can be obtained. As a result, a reduction in power of the vacuum evacuation system can be achieved, and the standing position can be firmly maintained.

The connecting plate having the Z-shaped notched portion serves to prevent the X- and Y-axis sliders as the main components of the vertical XY stage from being adversely affected by assembly errors of the mechanisms, changes in size due to thermal expansion of each member or application of the Y-axis stage weight, and the like.

In addition, since the horizontal and vertical portions of the L-shaped X-axis slider respectively constitute the slider main body and the guide of the Y-axis slider, and the Y-axis slider and the stage are mounted in the space surrounded by the horizontal and vertical portions, for example, transfer of X-ray masks and wafers is facilitated. In addition, a lead screw can be arranged at the center of gravity located at the middle position between the mounting mechanism and the horizontal or vertical portion so that the X- or Y-axis slider can be driven at a position near the center of gravity at which the slider does not swing. The constant-force mechanism using the spiral spring is advantageous in equalizing forward and reverse loads of the motor due to a vertical motion of the Y-axis slider. In addition to this advantage, the paths of wires can be arbitrarily designed in accordance with the positions and inclinations of the pulleys, and weight distribution and balancing of centers of gravity are facilitated. As a result, driving at the centers of gravity can be realized, and hence fine positioning control is facilitated.

Note that if the total air hydrostatic scheme in which air bearings are constituted by guides and lead screws is used, since the air bearings allow lead accuracy ten or more times higher than the machining accuracy of a member, the final accuracy required for SR exposure can be achieved by only the vertical XY stage. In addition, the sandwich type air bearings are used in the X and Y directions, whereas the air bearing for balancing the air bearing pressure and the attractive force of the magnets is used in the Z direction perpendicular to the XY plane. With this structure, the vertical XY stage can satisfy contradictory requirements, i.e., an improvement in lead accuracy and a reduction in size and weight of the stage. In addition, the characteristic features inherent in air bearings, e.g., equalization of bearing clearances, no friction, long life, cleanliness, and the like, contribute to an increase in positioning accuracy and application of the system.

What is claimed is:

1. A vertical XY stage comprising:
    a base;
    an X-axis slider movably mounted on said base;
    a Y-axis slider movably mounted on said X-axis slider; and
    a stage on which workpieces are arranged,
    wherein said Y-axis slider includes a horizontally arranged slider main body, and a vertical portion vertically arranged and having a guide for allowing said Y-axis slider to move in a Y-axis direction,
    said stage is arranged in a space surrounded by said slider main body and said vertical portion of said Y-axis slider, and
    wherein said stage is pivoted through a shaft mounted on said Y-axis slider.

2. An XY stage according to claim 1, wherein said shaft for pivoting said stage is mounted on said slider main body of said Y-axis slider to allow said stage to be reclined.

3. An XY stage according to claim 2, wherein said shaft includes a spring for reducing an effect of gravity applied to said shaft when said stage is set upright.

4. An XY stage according to claim 1, wherein said shaft for pivoting said stage is mounted on said slider main body of said Y-axis slider to allow said stage to horizontally pivot.

5. An XY stage according to claim 1, further comprising clutch means for coupling said stage to a driving source for pivoting said stage when said X- and Y-axis sliders are located at predetermined positions.

6. An XY stage according to claim 1, wherein a pulley is fixed and arranged above a vertical portion of said X-axis slider, a taking-up drum using a spiral spring is arranged below said X-axis slider, and said Y-axis slider and said taking-up drum are coupled to each other through said pulley, so that a weight applied to said Y-axis slider and torque of said taking-up drum are balanced by said spiral spring.

7. An XY stage according to claim 1, further comprising:
    a fixing member integrally formed upright with said base;
    an X-axis sub-slider arranged on said fixing member; and
    a connecting plate arranged between said X-axis sub-slider and said Y-axis slider.

8. An XY stage according to claim 7, wherein a Z-shaped groove is formed on said connecting plate.

9. An XY stage according to claim 1, wherein said X- and Y-axis sliders are guided through air hydrostatic guides.

* * * * *